(12) United States Patent
Rolandi

(10) Patent No.: US 6,882,231 B2
(45) Date of Patent: Apr. 19, 2005

(54) ADJUSTABLE FREQUENCY OSCILLATOR WITH PROGRAMMABLE CALIBRATING CIRCUIT AND RELATED SYSTEM AND METHOD

(75) Inventor: Paolo Rolandi, Voghera (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 42 days.

(21) Appl. No.: 10/406,628

(22) Filed: Apr. 2, 2003

(65) Prior Publication Data

US 2004/0008090 A1 Jan. 15, 2004

(30) Foreign Application Priority Data

Apr. 2, 2002 (IT) .................................... TO2002A0288

(51) Int. Cl.[7] ............................................... H03B 27/00
(52) U.S. Cl. .......................................... 331/57; 331/1 A
(58) Field of Search ........................... 331/57, 1 A, 34, 331/185; 327/160, 161

(56) References Cited

U.S. PATENT DOCUMENTS

| | | | |
|---|---|---|---|
| 5,406,228 A | * | 4/1995 | Hoang ......................... 331/1 A |
| 5,859,571 A | | 1/1999 | Lee et al. |
| 6,369,661 B1 | * | 4/2002 | Scott et al. .................... 331/45 |
| 6,617,935 B1 | * | 9/2003 | Nguyen ........................ 331/57 |

* cited by examiner

Primary Examiner—Robert Pascal
Assistant Examiner—Joseph Chang
(74) Attorney, Agent, or Firm—Lisa K. Jorgenson; Bryan A. Santarelli; Graybeal Jackson Haley LLP

(57) ABSTRACT

An adjustable frequency oscillator circuit includes: an odd number of inverters connected so as to form a loop; a plurality of capacitive elements each connected to an output terminal of a respective inverter; and an output terminal, which supplies a signal oscillating at an oscillating frequency. The oscillator circuit further includes a calibration circuit for calibrating maximum currents which can be delivered by the inverters to the respective capacitive elements.

34 Claims, 2 Drawing Sheets

Figure 1:
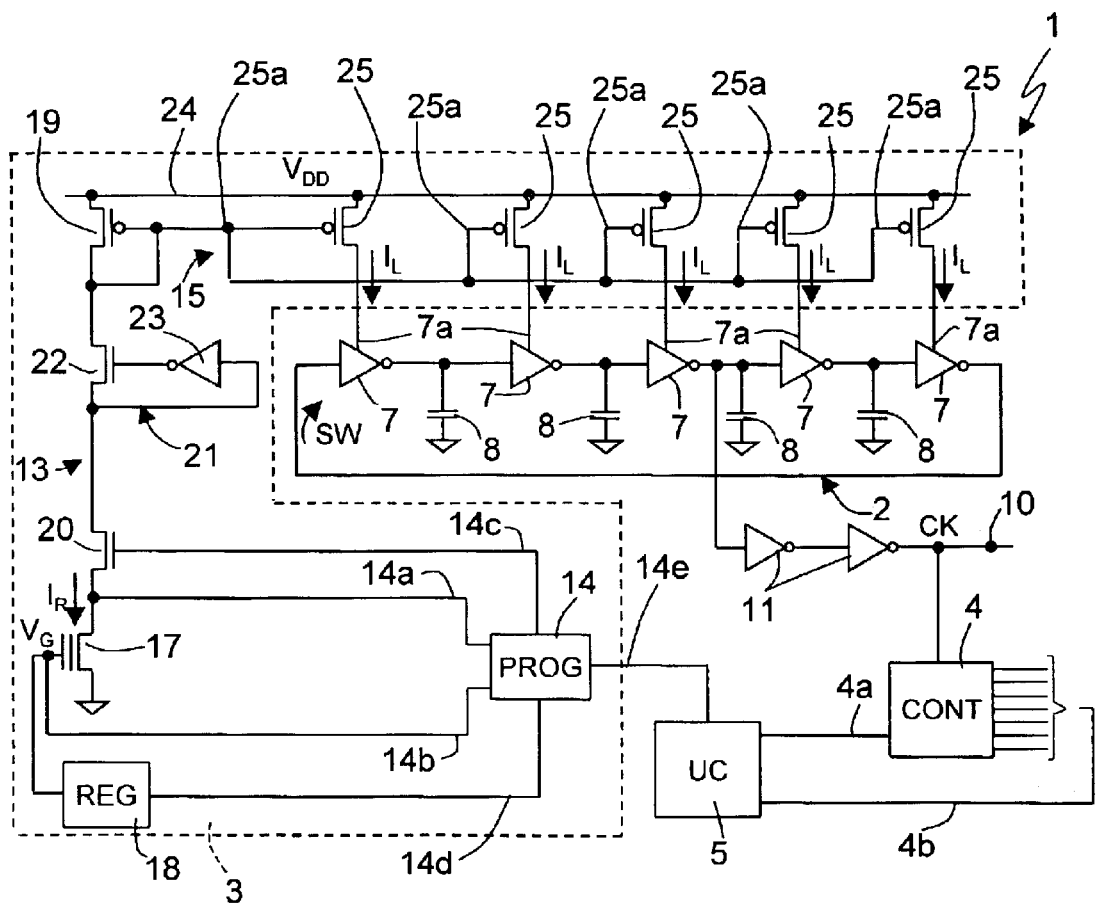

ADJUSTABLE FREQUENCY OSCILLATOR WITH PROGRAMMABLE CALIBRATING CIRCUIT AND RELATED SYSTEM AND METHOD

PRIORITY CLAIM

This application claims priority from Italian patent application No. TO2002A 000288, filed Apr. 2, 2002, which is incorporated herein by reference.

TECHNICAL FIELD

The present invention relates generally to an adjustable frequency oscillator circuit and to a corresponding calibration method.

BACKGROUND

As is known, digital oscillator circuits are very often based upon astable circuits comprising an odd number of logic inverters, connected to one another so as to form a loop, and a plurality of capacitive elements, inserted between the outputs of respective inverters and a reference potential line, for example, ground. Such astable circuits have a natural frequency that depends upon various factors, among which, in particular, the switching voltages of the inverters, the currents supplied by the inverters themselves, and the capacitance of the individual capacitive elements.

Of course, it is of extreme importance that the natural frequency of an oscillator should be equal or at least close to a nominal frequency fixed in the design stage and defined on the basis of particular combinations of the factors listed above.

The fabrication processes currently used are however affected by a margin of imprecision which cannot be eliminated and, consequently, the characteristics of the active and passive components made may differ significantly with respect to the design values. On account of such imprecisions, the switching speed of the individual inverters is different from the one envisaged and consequently also the natural frequency of the oscillator is influenced by the process parameters and can show unacceptable deviations with respect to the nominal frequency.

Currently, it is known in the art to use compensation circuits which enable control of operation of the oscillator so as to modify the natural frequency of oscillation and reduce the sensitivity with respect to the variations of the process parameters.

However, the use of compensation circuits also entails some drawbacks. In fact, even if the imprecisions in the natural frequency of the oscillator caused by the process variations can be in effect reduced, on the other hand, the dependency upon other potentially variable quantities such as supply voltage and temperature increases considerably. Hence, in practice, known compensation circuits introduce factors of instability which render the oscillation frequency in any case far from precise.

In addition, oscillators provided with compensation circuits are rather complex and disadvantageously have large overall dimensions.

SUMMARY

One embodiment of the present invention provides an adjustable frequency digital oscillator which is free from the drawbacks described above.

BRIEF DESCRIPTION OF THE DRAWINGS

For a better understanding of the present invention, some embodiments thereof are now described, purely by way of non-limiting example and with reference to the annexed drawings, in which:

FIG. 1 is a circuit diagram of an oscillator circuit according to a first embodiment of the present invention;

FIG. 2 is a more detailed circuit diagram of a part of the oscillator circuit of FIG. 1;

FIG. 3 shows the plots of quantities which refer to the oscillator circuit of FIG. 1; and FIG. 4 is a circuit diagram of an oscillator circuit according to a different embodiment of the present invention.

DETAILED DESCRIPTION

With reference to FIG. 1, the reference number 1 designates, as a whole, an adjustable frequency oscillator comprising an astable circuit 2, a calibration circuit 3, a counter 4, and a control unit 5.

The astable circuit 2 comprises an odd number of current limited CMOS inverters 7 (five, in the example shown), connected to one another so as to form a loop, and a plurality of capacitors 8, each of which is connected between ground and the output terminal of a respective CMOS inverter 7. In this case, in particular, there are four capacitors 8. In addition, the output terminal of one of the CMOS inverters 7 is connected to an output 10 of the oscillator 1 through two output inverters 11 in series. In particular, the output 10 supplies an oscillating output signal CK, as is explained hereinafter.

The calibration circuit 3 comprises a reference branch 13, a programming circuit 14 for programming the reference branch 13, and a limiting stage 15.

In greater detail, the reference branch 13 comprises a programmable nonvolatile memory cell 17, for example, of an EEPROM or Flash type, a voltage regulator 18 and a load transistor 19. The cell 17 has its source terminal connected to ground and its gate terminal and drain terminal connected, respectively, to a first programming terminal 14*a* and a second programming terminal 14*b* of the programming circuit 14. In addition, the gate terminal of the cell 17 is connected to a regulation terminal 18*a* of the voltage regulator 18, which supplies a regulated gate voltage $V_G$. The load transistor 19, of a PMOS type, has its source terminal connected to a supply line 24, which supplies a supply voltage $V_{DD}$, and is diode-connected, i.e., its gate and drain terminals are directly connected together. In addition, the drain terminals of the cell 17 and of the load transistor 19 are connected to one another via a switch 20 and a cascode stage 21, comprising a cascode transistor 22 and a cascode inverter 23, connected between the drain terminal and gate terminal of the cascode transistor 22. The switch 20 is here a NMOS transistor having its gate terminal connected to a first control terminal 14*c* of the programming circuit 14. In practice, the cell 17 is a programmable constant current generator, which supplies a reference current $I_R$, the value of which can be selected in a continuous range of current values. In addition, the reference current $I_R$ itself flows also in the load transistor 19.

The programming circuit 14 is a circuit for programming nonvolatile memory cells, of a known type, and has a second control terminal 14*d* connected to an input of the voltage regulator 17, and a programming input 14*e* connected to a programming output of the control unit 5, which supplies a programming signal P. In particular, during a step of calibration of the oscillator 1, the programming circuit 14 supplies to the gate and drain terminals of the cell 17 respective programming voltages so as to bring a threshold voltage $V_T$ of the cell 17 itself to a value correlated to the programming signal P.

The limiting stage 15 comprises a plurality of limiting transistors 25, of a PMOS type, connected to the load transistor 19 in a current mirror configuration with a mirror ratio, for example, of unity. In particular, the limiting transistors 25, which are equal in number to the number of the CMOS inverters of the astable circuit 2, all have their source terminals connected to the supply line 24 and their gate terminals 25a connected to the gate terminal of the load transistor 19. In addition, each limiting transistor 25 has its drain terminal connected to a limitation terminal 7a of a respective CMOS inverter 7. Consequently, each of the limiting transistors 25 is able to supply to the respective CMOS inverter 7 a limited current $I_L$ equal to the reference current $I_R$.

Figure 2:
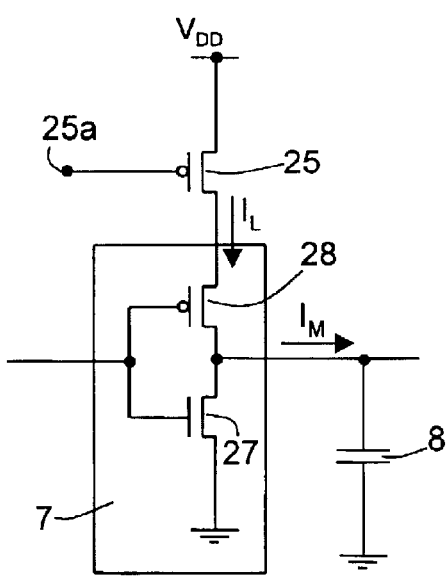

FIG. 2 shows in detail one of the CMOS inverters 7, together with the capacitive element 8 and the limiting transistor 25 associated thereto. The CMOS inverter 7 comprises a first transistor 27, of an NMOS type, and a second transistor 28, of a PMOS type, the said transistors having gate terminals in common, so as to form the input stage of the CMOS inverter 7, and drain terminals also in common, so as to form the output terminal of the CMOS inverter 7. In addition, the first transistor 27 has its source terminal connected to ground, while the source terminal of the second transistor 28 forms the limitation terminal 7a of the CMOS inverter 7. Clearly, when the second transistor 28 conducts, the maximum current $I_M$ which can be delivered by the CMOS inverter 7 is equal to the limited current $I_L$ supplied by the respective limiting transistor 25.

With reference once again to FIG. 1, the counter 4 is a counter of a known type, for instance, an 8-bit counter, and has a count input connected to the output 10 of the oscillator 1, an activation input 4a connected to an activation output of the control unit 5, which supplies an activation logic signal START, and a plurality of outputs 4b (here eight). In particular, the outputs 4b of the counter 4 are connected to respective inputs of the control unit 5 and supply a count signal NC, which represents the number of counts carried out by the counter 4 after its activation.

The control unit 5 is of a known type and, in particular, in the step of calibration of the oscillator 1, activates the counter 4, setting the activation signal START to an activation level for a predetermined time interval; compares the count signal NC with a nominal number of counts, which is stored in a register of the control unit 5 (not illustrated herein) and is correlated to a nominal frequency of the oscillator 1; and generates the programming signal P, which is correlated to the difference between the count signal NC and the nominal number of counts.

Operation of the oscillator 1 is described hereinafter. The astable circuit 2 oscillates with a natural frequency which depends upon the number of CMOS inverters 7 and of capacitive elements 8 present, as well as upon the maximum current $I_M$ which can be delivered by the CMOS inverters 7, their switching voltages $V_S$, and the capacitances of the capacitive elements 8. In practice, a switching signal SW cyclically circulates through the astable circuit 2 and propagates with a speed determined by the switching speed of the individual CMOS inverters 7. The switching speed of the CMOS inverters 7 depends, in turn, upon the rapidity with which the CMOS inverters 7 themselves are able to charge the capacitive elements 8 connected to the respective output terminals, i.e., it depends upon the maximum current $I_M$ that can be delivered, which is equal to the limited current $I_L$ supplied by the limiting transistors 25.

Figure 3:
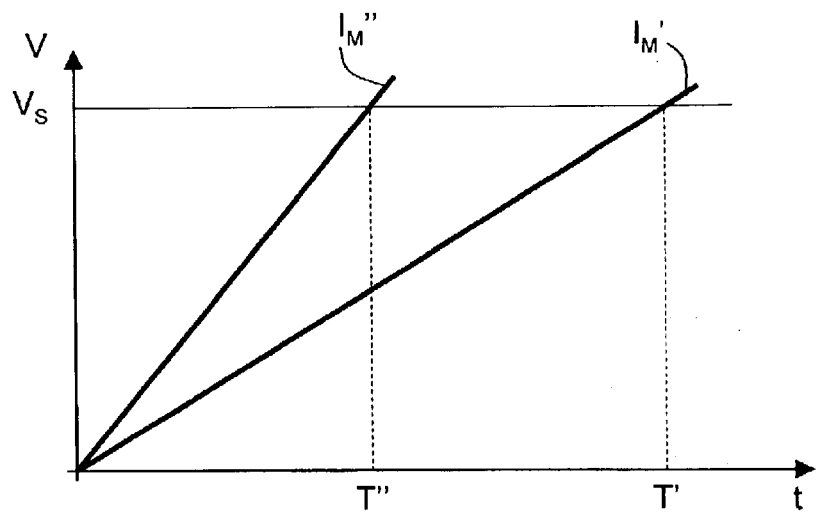

By way of example, FIG. 3 illustrates plots of the voltage at output from one of the CMOS inverters 7, in the presence of a first value $I_M'$ and a second value $I_M''$ of the maximum current $I_M$ that can be delivered (in this case, $I_M''>I_M'$). FIG. 3 further shows corresponding switching intervals T', T", which represent, in each of the two cases, the time necessary for the voltage at output from the CMOS inverter 7 in question to reach the switching voltage $V_S$ of the CMOS inverter 7 set immediately downstream.

As previously mentioned, the limited current $I_L$ is moreover equal to the reference current $I_R$ which flows in the cell 17 and in the load transistor 19. More precisely, the cell 17, previously programmed in order to have a nominal threshold voltage $V_T$, is sent into conduction by the voltage regulator 18 and conducts the reference current $I_R$, which is repeated through the load transistor 19 and the limiting transistors 25, when the respective CMOS inverters 7 conduct.

In order to calibrate the oscillator 1, the natural frequency is initially estimated using the counter 4. Then, the programming state of the cell 17 is modified through the programming circuit 14, according to the difference between the estimated natural frequency and the nominal frequency fixed in the design stage. In this way, the reference current $I_R$ which flows in the cell 17, the limited currents $I_L$ supplied by the limiting transistors 25, and the maximum current $I_M$ that can be delivered by the CMOS inverters 7 are also modified. Consequently, the switching speed of the CMOS inverters 7 and the propagation speed of the switching signal SW through the astable circuit 2 vary and, hence, the natural frequency of the oscillator 1 is modified.

In greater detail, the counter 4 is initially activated by the control unit 5 for an estimation interval of predetermined duration. During the said estimation interval, the output signal CK, which oscillates at the natural frequency of the oscillator 1, is supplied on the output 10 and fed to the count input of the counter 4. Consequently, the count signal NC of the counter 4 is incremented by one unit at each cycle of the output signal CK, for example, at the rising edges thereof.

At the end of the estimation interval, the control unit 5 compares the value of the count signal NC with the nominal number of counts stored, i.e., with the number of cycles of the output signal CK which the counter 4 is to detect in the estimation interval when the natural frequency of the oscillator 1 is equal to the nominal frequency. In addition, the control unit 5 supplies a value of the programming signal P correlated to the difference between the value of the count signal NC and the nominal number of counts. Then, the programming circuit 14, in a conventional manner, de-activates the voltage regulator 18 and programs the cell 17, by modifying its threshold voltage $V_T$ according to the value of the programming signal P. In particular, if the natural frequency of the oscillator 1 is less than the nominal frequency, the threshold voltage $V_T$ of the cell 17 is reduced, and hence the reference current $I_R$ flowing in the cell 17 increases. If, however, the natural frequency of the oscillator 1 is greater than the nominal frequency, the threshold voltage $V_T$ of the cell 17 is increased, so as to reduce the reference current $I_R$. In this way, the maximum current $I_M$ that each CMOS inverter 7 can deliver for charging the respective capacitive element 8 is also modified. In fact, as has been explained previously, the said maximum current $I_M$ is equal to the limited current $I_L$ that each limiting transistor 25 is able to supply to the respective CMOS inverter 7. On the other hand, since the limiting transistors 25 are connected as current mirrors with the load transistor 19, the limited currents $I_L$ are in turn equal to the reference current $I_R$ imposed by the cell 17.

In practice, if the estimated natural frequency is less than the nominal frequency, the maximum current $I_M$ that can be delivered by the CMOS inverters 7 is increased so as to render switching of the CMOS inverters 7 more rapid, and hence the natural frequency of the oscillator 1 increases. If, however, the estimated natural frequency is greater than the nominal frequency, the maximum current $I_M$ that can be delivered by the CMOS inverters 7 is reduced, and the natural frequency of the oscillator 1 decreases.

The calibration procedure described herein may possibly be repeated in an iterative manner, until the natural frequency of the oscillator 1 is substantially equal to the nominal frequency fixed in the design stage.

The above-described embodiment of the invention has the following advantages. In the first place, the natural frequency of the oscillator 1 can be calibrated with high precision. In fact, the maximum current that can be delivered by the CMOS inverters 7, which, in practice, determines the natural frequency, can be regulated by acting upon the reference current $I_R$, i.e., in the last resort, upon the threshold voltage $V_T$ of the cell 17. On the other hand, the procedures and circuits for programming nonvolatile memory cells are well known and enable control of the threshold voltages of the cells in an extremely accurate way.

In addition, the oscillator 1 is free from any components that are particularly sensitive to the operating conditions, and hence the natural frequency is normally stable. However, if the oscillator 1 is used in operating conditions that are markedly variable and such as to affect the natural frequency, the calibration can easily be repeated at any moment.

A further advantage is provided by the fact that the oscillator 1 has contained overall dimensions.

Figure 4:
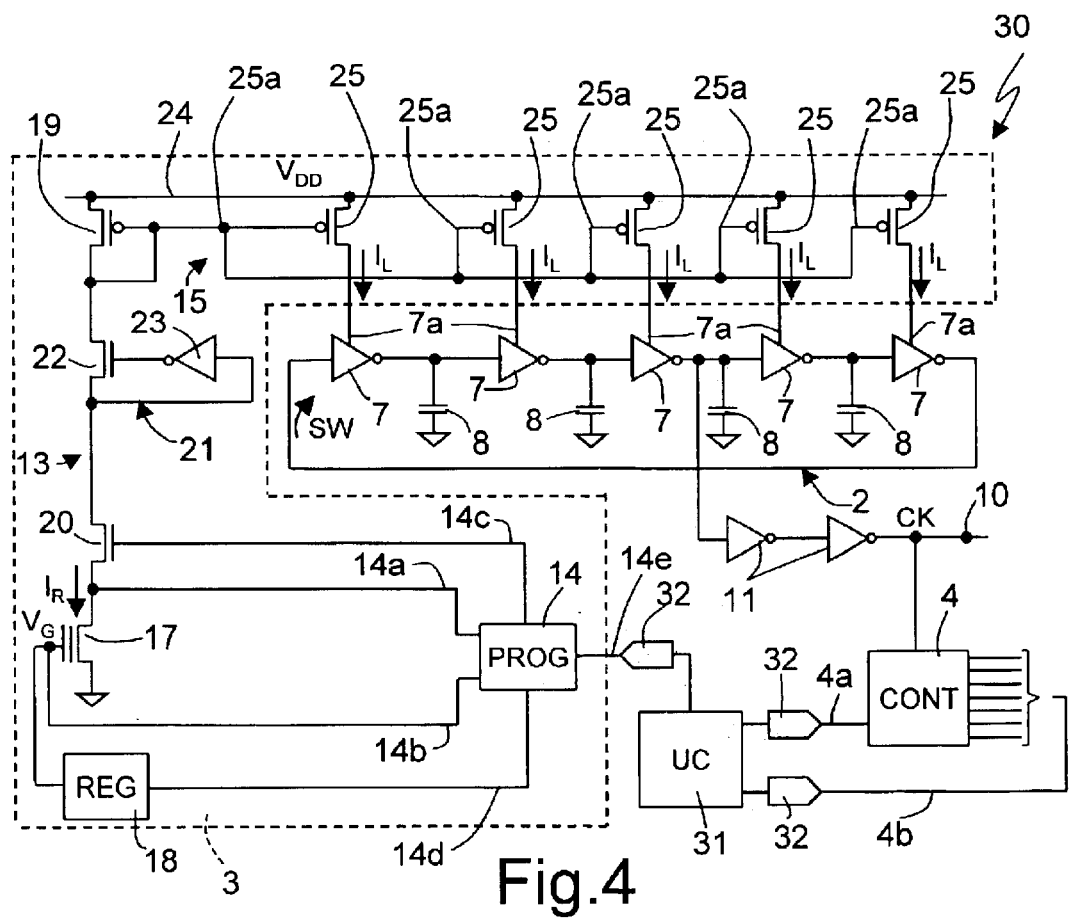

According to another embodiment of the invention, illustrated in FIG. 4, in which parts that are the same as those already shown are designated by the same reference numbers, an oscillator 30 is without the control unit 5. Furthermore, the activation input 4a and the outputs 4b of the counter 4 and the input 14e of the programming circuit 14 can be connected to an external control unit 31 by means of respective pins 32. Clearly, in this case, calibration can be performed only when the oscillator 30 is connected to the external control unit 31, for example, in the testing stage; on the other hand, calibration is in any case precise and, furthermore, the overall dimensions of the oscillator 30 are advantageously reduced to a considerable extent.

Referring to FIGS. 1 and 4, the oscillator 1, the oscillator 30, or both the oscillators 1 and 30, may be disposed in an integrated circuit (IC) such as a memory or a processor. Furthermore, such an IC may be included in an electronic system such as a computer system.

Finally, it is clear that modifications and variations may be made to the device described herein, without thereby departing from the scope of the present invention. For example, instead of the limiting transistors 25 of a PMOS type, NMOS transistors having drain terminals connected to the source terminals of respective first transistors 27 of the CMOS inverters 7 may be used.

What is claimed is:

1. An adjustable frequency oscillator circuit, comprising: a plurality of inverters connected so as to form a loop; a plurality of capacitive elements each connected to an output terminal of a respective inverter; and an output, which supplies a signal oscillating at an oscillating frequency;

wherein the oscillator circuit comprises a calibration circuit for calibrating maximum currents that can be delivered by the inverters to respective said capacitive elements, the calibration circuit comprising a programmable transistor operable to conduct a reference current, the calibration circuit operable to calibrate the maximum currents to the reference current.

2. The circuit according to claim 1, wherein said calibration circuit comprises a programmable reference branch, which includes the programmable transistor and which supplies the reference current, and a limiting stage, which is connected to said inverters and supplies to each of said inverters a respective limited current correlated to said reference current.

3. The circuit according to claim 2, wherein said limiting stage comprises a plurality of limiting transistors, each having a conduction terminal connected to a limitation terminal of a respective said inverter and supplying said respective limited current.

4. The circuit according to claim 3, wherein said programmable reference branch comprises a programmable current generator that includes the programmable transistor.

5. The circuit according to claim 4, wherein said programmable reference branch comprises a load transistor connected to said programmable current generator.

6. The circuit according to claim 5, wherein said limiting transistors are connected to said load transistor in a current mirror configuration.

7. The circuit according to claim 2, wherein it comprises a programming circuit for programming said programmable reference branch.

8. The circuit according to claim 7, wherein it comprises: a control unit having a plurality of inputs connected to respective said outputs of said counter; an activation output, connected to an activation terminal of said counter, for activating said counter for a time interval of predetermined duration; and a programming output, connected to a programming input of said programming circuit.

9. The circuit according to claim 1, wherein it comprises an estimator circuit connected to said output for estimating the frequency of said oscillating signal.

10. The circuit according to claim 9, wherein said estimator circuit comprises a counter, having a count input connected to said output and a plurality of outputs, supplying a count signal correlated to the frequency of said oscillating signal.

11. The circuit according to claim 1, wherein said programmable transistor composes a programmable nonvolatile memory cell.

12. A method for calibration of an oscillator circuit, comprising: a plurality of inverters connected so as to form a loop; a plurality of capacitive elements each connected to an output terminal of a respective inverter; and an output, which supplies an oscillating signal;

the method comprising the step of calibrating a maximum current that can be delivered by the inverters to respective said capacitive elements by adjusting a threshold voltage of a non-volatile transistor that conducts a reference current that is related to the threshold voltage, the maximum current being related to the reference current.

13. The method according to claim 12, in which said step of calibrating comprises:

programming the reference current according to a difference between an oscillating frequency of said oscillating signal and a nominal frequency; and supplying to said inverters respective limited currents correlated to said reference current.

14. The method according to claim 13, in which said non-volatile transistor composes a nonvolatile memory cell.

15. The method according to claim 13, in which said step of calibrating comprises:
   estimating said oscillation frequency of said oscillating signal; and
   comparing said oscillation frequency with said nominal frequency.

16. The method according to claim 15, in which said step of estimating comprises detecting a count signal correlated to a number of oscillations of said signal oscillating in a predetermined time interval.

17. An oscillator circuit, comprising:
   an oscillator having a first oscillator stage and a second oscillator stage, the first stage operable to generate an oscillator signal by driving the second stage with a drive current; and
   a calibration circuit coupled to the first oscillator stage and including a floating-gate transistor, the calibration circuit operable, in response to the transistor, to limit the drive current to a value that causes the oscillator signal to substantially have a predetermined frequency.

18. The circuit of claim 17 wherein the first and second oscillator stages each comprise a respective inverter.

19. The circuit of claim 17 wherein:
   the floating-gate transistor is operable to generate a reference current; and
   the calibration circuit comprises a current mirror having an input leg operable to conduct the reference current and an output leg operable to supply the drive current to the first oscillator stage.

20. The circuit of claim 17 wherein:
   the floating-gate transistor is operable to generate a reference current; and
   the calibration circuit comprises,
      a current mirror having an input leg operable to conduct the reference current and having an output leg operable to generate the drive current in as a function of the reference current and to supply the drive current to the first oscillator stage,
      a frequency detector coupled to the oscillator and operable to determine the frequency of the oscillator signal, and
      a controller coupled to the generator and the frequency detector and operable to control the reference current such that the oscillator signal substantially has the predetermined frequency.

21. The circuit of claim 17 wherein the first oscillator stage is operable to generate the oscillator signal by charging a load capacitance with the drive current.

22. The circuit of claim 17 wherein:
   the floating-gate transistor has a threshold voltage and is operable to generate a reference current as a function of the threshold voltage; and
   the calibration circuit is operable to limit the drive current to a value that is a function of the reference current.

23. An oscillator circuit, comprising:
   an oscillator, including,
   first, second, and third serially coupled oscillator stages, each stage having a respective drive-current input node;
   a current mirror having a reference leg, and having first, second, and third output legs respectively coupled to the drive-current input nodes of the first, second, and third oscillator stages;
   a programmable transistor coupled to the reference leg of the current mirror;
   a frequency detector coupled to the oscillator; and
   a controller coupled to the frequency detector and the transistor.

24. The circuit of claim 23 wherein:
   the reference leg of the current mirror comprises a PMOS transistor; and
   the first, second, and third output legs each comprise a respective PMOS transistor.

25. The circuit of claim 23, further comprising:
   a supply node; and
   wherein the reference and output legs of the current mirror are coupled to the supply node.

26. An integrated circuit, comprising:
   an oscillator circuit, including,
   an oscillator having a first oscillator stage and a second oscillator stage, the first stage operable to generate an oscillator signal by driving the second stage with a drive current, and
   a calibration circuit coupled to the first oscillator stage and including a nonvolatile transistor that is operable to generate a reference signal, the calibration circuit operable to limit the drive current to a value that is related to the reference signal and that causes the oscillator signal to substantially have a predetermined frequency.

27. A system, comprising:
   an integrated circuit, including,
   an oscillator circuit, including,
   an oscillator having a first oscillator stage and a second oscillator stage, the first stage operable to generate an oscillator signal by driving the second stage with a drive current, and
   a calibration circuit coupled to the first oscillator stage and including a floating-gate transistor that is operable to generate an adjustable reference signal, the calibration circuit operable to limit the drive current to a value that is related to the reference signal and that causes the oscillator signal to substantially have a predetermined frequency.

28. A method, comprising:
   measuring a frequency of an oscillator signal from an oscillator; and
   if the frequency of the oscillator signal does not substantially equal a predetermined frequency, then adjusting a power-supply signal to the oscillator by adjusting the threshold of a programmable transistor such that the frequency of the oscillator signal substantially equals the predetermined frequency.

29. The method of claim 28 wherein measuring the frequency of the oscillator signal comprises:
   counting the cycles of the oscillator signal over a predetermined time; and
   comparing the counted number of cycles to a predetermined number that corresponds to the predetermined frequency.

30. The method of claim 28 wherein adjusting the power-supply signal comprises limiting a power-supply current to the oscillator such that the frequency substantially equals the predetermined frequency.

31. The method of claim 28 wherein adjusting the power-supply signal comprises adjusting a power-supply current to the oscillator by generating with the transistor a reference current that is related to the threshold of the transistor, the power-supply current having a maximum value that is proportional to the reference current.

32. A method, comprising:
measuring a frequency of an oscillator signal from an oscillator;
if the frequency of the oscillator signal does not substantially equal a predetermined frequency, then adjusting a power-supply signal to the oscillator such that the frequency of the oscillator signal substantially equals the predetermined frequency; and
wherein adjusting the power-supply signal comprises adjusting a power-supply current to the oscillator by adjusting a threshold of a nonvolatile transistor that generates a reference current, the power-supply current being a function of the reference current.

33. A method, comprising:
measuring a frequency of an oscillator signal from an oscillator;
if the frequency of the oscillator signal does not substantially equal a predetermined frequency, then adjusting a power-supply signal to the oscillator such that the frequency of the oscillator signal substantially equals the predetermined frequency; and
wherein adjusting the power-supply signal comprises,
adjusting a power-supply current to the oscillator by adjusting a threshold of a nonvolatile transistor that generates a reference current, the power-supply current being a function of the reference current, and
repeating the measuring of the frequency and the adjusting of the power-supply current until the frequency substantially equals the predetermined frequency.

34. An oscillator circuit, comprising:
an oscillator having a first oscillator stage and a second oscillator stage, the first stage operable to generate an oscillator signal by driving the second stage with a drive current;
a calibration circuit coupled to the first oscillator stage and operable to limit the drive current to a value that causes the oscillator signal to substantially have a predetermined frequency, the calibration circuit comprising,
a floating-gate transistor having a threshold voltage and operable to generate a reference current as a function of the threshold voltage,
a current mirror having an input leg operable to conduct the reference current and having an output leg operable to generate the drive current having a maximum value that is proportional to the reference current and operable to supply the drive current to the first oscillator stage,
a counter coupled to the oscillator and operable to determine the frequency of the oscillator signal,
a programmer coupled to the transistor and operable to set the threshold of the transistor, and
a controller coupled to the counter and the programmer and operable to cause the programmer to set the threshold of the transistor such that the oscillator signal substantially has the predetermined frequency.

* * * * *